US011487201B2

(12) United States Patent
Tsuchiya et al.

(10) Patent No.: US 11,487,201 B2
(45) Date of Patent: Nov. 1, 2022

(54) PHOTOSENSITIVE RESIN COMPOSITION, METHOD OF MANUFACTURING PATTERN CURED PRODUCT, CURED PRODUCT, INTERLAYER INSULATING FILM, COVER-COAT LAYER, SURFACE PROTECTIVE FILM, AND ELECTRONIC COMPONENT

(71) Applicant: HITACHI CHEMICAL DUPONT MICROSYSTEMS, LTD., Tokyo (JP)

(72) Inventors: Etsuharu Tsuchiya, Tokyo (JP);
Tetsuya Enomoto, Hitachi (JP);
Takashi Kawamori, Tokyo (JP);
Nobuyuki Saito, Hitachi (JP); Yukari Koibuchi, Hitachi (JP); Atsutaro Yoshizawa, Hitachi (JP); Akira Asada, Hitachi (JP)

(73) Assignee: HD MicroSystems, Ltd., Tokyo (JP)

( * ) Notice: Subject to any disclaimer, the term of this patent is extended or adjusted under 35 U.S.C. 154(b) by 219 days.

(21) Appl. No.: 16/498,139

(22) PCT Filed: Mar. 30, 2018

(86) PCT No.: PCT/JP2018/013598
§ 371 (c)(1),
(2) Date: Sep. 26, 2019

(87) PCT Pub. No.: WO2018/181893
PCT Pub. Date: Oct. 4, 2018

(65) Prior Publication Data
US 2021/0116809 A1 Apr. 22, 2021

(30) Foreign Application Priority Data

Mar. 31, 2017 (WO) .................. PCT/JP2017/013729

(51) Int. Cl.
*G03F 7/027* (2006.01)
*G03F 7/037* (2006.01)
*G03F 7/40* (2006.01)
*C08G 73/10* (2006.01)
*G03F 7/028* (2006.01)
*G03F 7/038* (2006.01)
*G03F 7/20* (2006.01)

(52) U.S. Cl.
CPC ............. *G03F 7/037* (2013.01); *C08G 73/10* (2013.01); *G03F 7/028* (2013.01); *G03F 7/0382* (2013.01); *G03F 7/2004* (2013.01)

(58) Field of Classification Search
CPC ........ G03F 7/037; G03F 7/027; G03F 7/0388; G03F 7/40
See application file for complete search history.

(56) References Cited

U.S. PATENT DOCUMENTS

| | | | | |
|---|---|---|---|---|
| 5,025,088 | A * | 6/1991 | Maeda | ............... G03F 7/0757 528/353 |
| 7,282,323 | B2 * | 10/2007 | Kanatani | ............... G03F 7/035 430/281.1 |
| 2015/0372037 | A1 * | 12/2015 | Tomeba | ............ H01L 27/14645 257/432 |

FOREIGN PATENT DOCUMENTS

| | | |
|---|---|---|
| JP | 2004-133435 A | 4/2004 |
| JP | 2006-193691 A | 7/2006 |
| JP | 2006-342310 A | 12/2006 |
| JP | 2009-227959 A | 10/2009 |
| JP | 2012-198361 A | 10/2012 |
| JP | 2016-199662 A | 12/2016 |
| WO | 2006/098291 A1 | 9/2006 |
| WO | 2015/052885 | 4/2015 |
| WO | 2015/199219 | 12/2015 |

* cited by examiner

*Primary Examiner* — John S Chu
(74) *Attorney, Agent, or Firm* — Fitch, Even, Tabin & Flannery, LLP

(57) ABSTRACT

A photosensitive resin composition comprising (A) a polyimide precursor having a polymerizable unsaturated bond; (B) a polymerizable monomer having an aliphatic cyclic skeleton; (C) a photopolymerization initiator; and (D) a solvent.

14 Claims, 1 Drawing Sheet

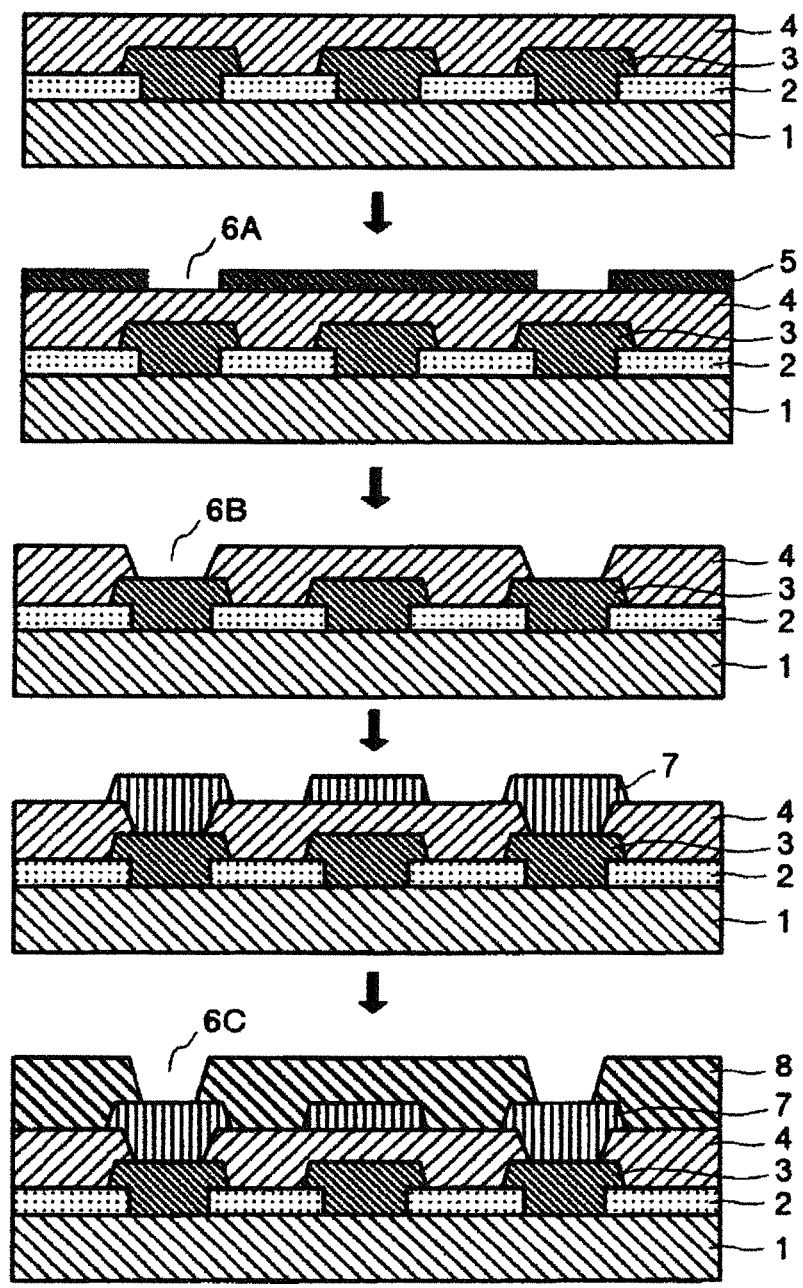

PHOTOSENSITIVE RESIN COMPOSITION, METHOD OF MANUFACTURING PATTERN CURED PRODUCT, CURED PRODUCT, INTERLAYER INSULATING FILM, COVER-COAT LAYER, SURFACE PROTECTIVE FILM, AND ELECTRONIC COMPONENT

CROSS-REFERENCE TO RELATED APPLICATIONS

This application is a U.S. national phase application filed under 35 U.S.C. § 371 of International Application No. PCT/JP2018/013598, filed Mar. 30, 2018, designating the United States, which claims priority from International Application No. PCT/JP2017/013729, filed Mar. 31, 2017, which are hereby incorporated herein by reference in their entirety.

TECHNICAL FIELD

The present invention relates to a photosensitive resin composition, a method of manufacturing a pattern cured product, a cured product, an interlayer insulating film, a cover coat layer, a surface protective film, and an electronic component.

BACKGROUND ART

Conventionally, polyimide or polybenzoxazole having excellent heat resistance, electrical characteristics, mechanical characteristics, and the like has been used for the surface protective film and the interlayer insulating film of the semiconductor element. In recent years, a photosensitive resin composition in which photosensitive characteristics are imparted to these resins itself has been used, and by using this photosensitive resin composition, the manufacturing process of a pattern cured product can be simplified, and a complicated manufacturing process can be shortened. (See, e.g., Patent Document 1)

Incidentally, in recent years, the miniaturization of transistors which has supported the enhancement of the performance of computers has come to the limit of scaling law, and a laminated device structure in which semiconductor elements are three-dimensionally laminated for further enhancement of the performance and speed has attracted attention (for example, refer to Non-Patent Document 1).

Among the laminated device structures, the multi-die fan-out wafer level package (Multi-die Fanout Wafer Level Packaging) is a package that collectively seals a plurality of dies in one package, and has attracted much attention because it can be expected to have lower costs and higher performance than conventionally proposed fan-out wafer level packages (manufactured by sealing one die in one package).

In manufacturing a multi-die fan-out wafer level package, low-temperature curing is strongly required from the viewpoint of protecting a high-performance die, protecting a sealing material having low heat resistance, and improving yield (for example, see Patent Document 2).

RELATED ART DOCUMENT

Patent Document

Patent Document 1: JP-A-2009-265520
Patent Document 2: WO 2008/111470

Non-Patent Document

Non-Patent Document 1: "Semiconductor Technical Yearbook 2013 Part: Packaging/Mounting," Nikkei BP, Inc., p 41-p 50.

SUMMARY OF THE INVENTION

It is an object of the present invention to provide a photosensitive resin composition, a method of manufacturing a pattern cured product, a cured product, an interlayer insulating film, a cover coat layer, a surface protective film, and an electronic component, which can form a cured product having excellent adhesiveness and migration resistance even when cured at a low temperature of 200° C. or less.

According to the invention, the following photosensitive resin composition and the like are provided.

1. A photosensitive resin composition comprising:
(A) a polyimide precursor having a polymerizable unsaturated bond;
(B) a polymerizable monomer having an aliphatic cyclic skeleton;
(C) a photopolymerization initiator; and
(D) a solvent.
2. The photosensitive resin composition according to 1, wherein the component (A) is a polyimide precursor having a structural unit represented by the following formula (1):

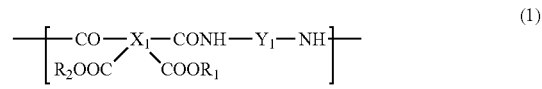

wherein in the formula (1), $X_1$ is a tetravalent aromatic group, —$COOR_1$ group and —CONH— group are on the ortho-position to each other, —$COOR_2$ group and —CO— group are on the ortho-position to each other; $Y_1$ is a divalent aromatic group; $R_1$ and $R_2$ are independently a hydrogen atom, a group represented by the following formula (2), or an aliphatic hydrocarbon group having 1 to 4 carbon atoms; and at least one of $R_1$ and $R_2$ is a group represented by the formula (2):

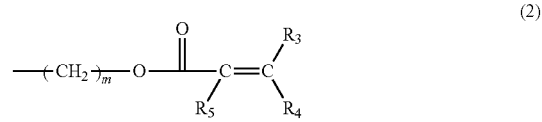

wherein in the formula (2), $R_3$ to $R_5$ is independently a hydrogen atom or an aliphatic hydrocarbon group having 1 to 3 carbon atoms, and m is an integer of 1 to 10.
3. The photosensitive resin composition according to 1 or 2, wherein the component (B) comprises a polymerizable monomer having a group comprising a polymerizable unsaturated double bond and having an aliphatic cyclic skeleton.
4. The photosensitive resin composition according to 3, wherein the polymerizable monomer has two or more groups comprising the polymerizable unsaturated double bond.
5. The photosensitive resin composition according to any one of 1 to 3, wherein the component (B) comprises a polymerizable monomer represented by the following formula (3):

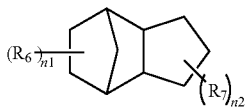

(3)

wherein in the formula (3), $R_6$ and $R_7$ are independently an aliphatic hydrocarbon group having 1 to 4 carbon atoms or a group represented by the following formula (4); n1 is 0 or 1; n2 is an integer of 0 to 2; the number of n1+n2 is 1 or more; and at least one of n1-number of $R_6$ and n2-number of $R_7$ is a group represented by the following formula (4):

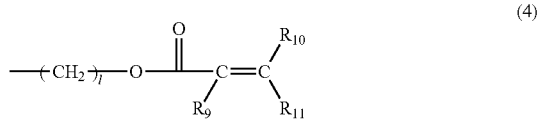

(4)

wherein in the formula (4), $R_9$ to $R_{11}$ is independently a hydrogen atom or an aliphatic hydrocarbon group having 1 to 3 carbon atoms, and I is an integer of 0 to 10.

6. The photosensitive resin composition according to 5, wherein the number of n1+n2 is 2 or 3.

7. The photosensitive resin composition according to any one of 1 to 6, wherein the component (B) comprises a polymerizable monomer represented by the following formula (5).

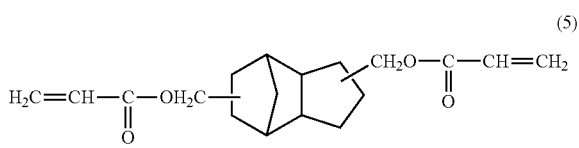

(5)

8. The photosensitive resin composition according to any one of 1 to 7, further comprising (E) a thermal polymerization initiator.

9. A method of manufacturing the pattern cured product comprising:

applying the photosensitive resin composition according to any one of 1 to 8 on a substrate and drying the photosensitive resin composition to form a photosensitive resin film;

pattern-exposing the photosensitive resin film to obtain a resin film;

developing the resin film after the pattern exposure using an organic solvent to obtain a pattern resin film; and heat-treating the pattern resin film.

10. The method for manufacturing a pattern cured product according to 9, wherein a temperature of the heat treatment is 200° C. or less.

11. A cured product obtained by curing the photosensitive resin composition according to any one of 1 to 8.

12. The cured product according to 11, which is a pattern cured product.

13. An interlayer insulating film, a cover coat layer or a surface protective film manufactured by using the cured product according to 11 or 12.

14. An electronic component comprising the interlayer insulating film, the cover coat layer, or the surface protective film according to 13.

According to the present invention, a photosensitive resin composition, a method of manufacturing a pattern cured product, a cured product, an interlayer insulating film, a cover coat layer, a surface protective film, and an electronic component, which can form a cured product having excellent adhesiveness and migration resistance even when cured at a low-temperature of 200° C. or less, can be provided.

BRIEF DESCRIPTION OF THE DRAWINGS

FIG. 1 is a manufacturing process diagram of an electronic component according to an embodiment of the present invention.

MODE FOR CARRYING OUT THE INVENTION

Embodiments of a photosensitive resin composition of the present invention, a method of manufacturing a pattern cured product using the photosensitive resin composition, a cured product, an interlayer insulating film, a cover coat layer, a surface protective film, and an electronic component will be described below in detail. The present invention is not limited to the following embodiments.

In the present specification, "A or B" may include either or both of A and B. Moreover, a term "step" herein includes not only an independent step, but also a step if expected action of the step is achieved, even when the step is not clearly distinguishable from other steps.

A numeric value range represented by using "to" indicates the range including numeric values described before and after "to" as a minimum value and a maximum value, respectively. Moreover, when a plurality of materials corresponding to each component exist in a composition, unless otherwise specified, a content of each component in the composition herein means a total amount of the plurality of materials existing in the composition. Further, unless otherwise specified, materials listed as examples may be used alone or in combination of two or more.

The term "(meth)acrylic group" means "acrylic group" and "methacrylic group".

The photosensitive resin composition of the present invention comprises (A) a polyimide precursor having a polymerizable unsaturated bond (hereinafter, also referred to as a "component (A)"), (B) a polymerizable monomer having an aliphatic cyclic skeleton (hereinafter, also referred to as a "component (B)"), (C) a photopolymerization initiator (hereinafter, also referred to as a "component (C)"), and (D) a solvent (hereinafter, also referred to as a "component (D)").

As a result, even when cured at a low temperature of 200° C. or less, a cured product having excellent adhesiveness and migration resistance can be formed.

As an arbitrary effect, a cured product having excellent chemical resistance and a high residual film ratio after curing can be formed.

The photosensitive resin composition of the present invention is preferably a negative photosensitive resin composition.

The component (A) is not particularly limited, but a polyimide precursor having high transmittance when i-line is used as a light source during patterning and exhibiting high cured product characteristics even when cured at a low temperature of 200° C. or less is preferable.

Examples of the polymerizable unsaturated bond include a carbon-carbon double bond and the like.

The component (A) is preferably a polyimide precursor having a structural unit represented by the following formula (1). As a result, the transmittance of the i-line is high, and a satisfactory cured product can be formed even when cured at a low temperature of 200° C. or less.

The content of the structural unit represented by the formula (1) is preferably 50 mol % or more, more preferably 80 mol % or more, and still more preferably 90 mol % or more, based on all the structural units of the component (A). The upper limit is not particularly limited, and may be 100 mol %.

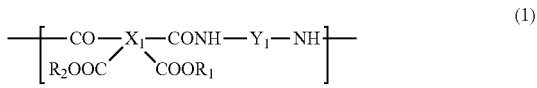

(1)

In the formula (1), $X_1$ is a tetravalent aromatic group, —$COOR_1$ group and —CONH— group are on ortho-position to each other, —$COOR_2$ group and —CO— group are on ortho-position to each other; $Y_1$ is a divalent aromatic group; $R_1$ and $R_2$ are independently a hydrogen atom, a group represented by the following formula (2), or an aliphatic hydrocarbon group having 1 to 4 carbon atoms, and at least one of $R_1$ and $R_2$ is a group represented by the formula (2).

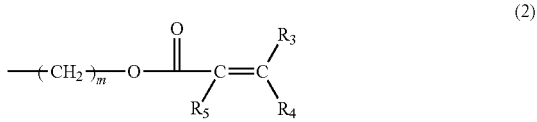

(2)

In the formula (2), $R_3$ to $R_5$ is independently a hydrogen atom or an aliphatic hydrocarbon group having 1 to 3 carbon atoms, and m is an integer of 1 to 10 (preferably an integer of 2 to 5, more preferably 2 or 3.

The tetravalent aromatic group of the $X_1$ of the formula (1) may be a tetravalent aromatic hydrocarbon group or a tetravalent aromatic heterocyclic group. A tetravalent aromatic hydrocarbon group is preferred.

Examples of the tetravalent aromatic hydrocarbon group of the $X_1$ of the formula (1) include, but are not limited to, a group represented by the following formula (6).

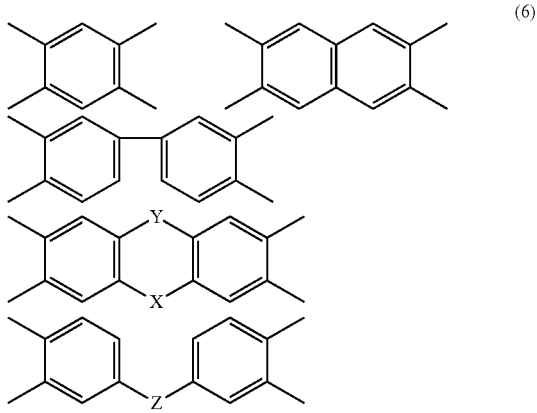

(6)

In the formula (6), X and Y independently represent a divalent group which is not conjugated to a benzene ring to which each is bonded, or a single bond; Z is an ether group (—O—) or a sulfide group (—S—) (—O— is preferable).

In the formula (6), the divalent group of X and Y, which is not conjugated to the benzene ring to which each is bonded, is preferably —O—, —S—, a methylene group, a bis(trifluoromethyl)methylene group, or a difluoromethylene group, more preferably —O—.

The divalent aromatic group of the $Y_1$ of the formula (1) may be a divalent aromatic hydrocarbon group or a divalent aromatic heterocyclic group. A divalent aromatic hydrocarbon group is preferable.

The divalent aromatic hydrocarbon group of the $Y_1$ of the formula (1) includes, but are not limited to, a group represented by the following formula (7).

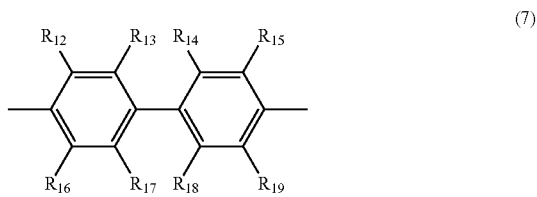

(7)

In the formula (7), $R_{12}$ to $R_{19}$ is independently a hydrogen atom, a monovalent aliphatic hydrocarbon group, or a monovalent organic group having a halogen atom.

Examples of the monovalent aliphatic hydrocarbon group (preferably having 1 to 10 carbon atoms, more preferably having 1 to 6 carbon atoms) of the $R_{12}$ to $R_{19}$ of the formula (7) include a methyl group and the like. For example, $R_{12}$ and $R_{15}$ to $R_{19}$ may be hydrogen atoms, and $R_{13}$ and $R_{14}$ may be monovalent aliphatic hydrocarbon groups.

As the monovalent organic group having a halogen atom (preferably a fluorine atom) of the $R_{12}$ to $R_{19}$ of the formula (7), a monovalent aliphatic hydrocarbon group having a halogen atom (preferably having 1 to 10 carbon atoms, more preferably having 1 to 6 carbon atoms) is preferable, and a trifluoromethyl group and the like are mentioned.

The aliphatic hydrocarbon group having 1 to 4 carbon atoms (preferably 1 or 2) of the $R_1$ and $R_2$ of the formula (1) includes a methyl group, an ethyl group, an n-propyl group, a 2-propyl group, an n-butyl group, and the like.

At least one of $R_1$ and $R_2$ in the formula (1) is a group represented by the formula (2), and both are preferably groups represented by the formula (2).

The aliphatic hydrocarbon group having 1 to 3 carbon atoms (preferably 1 or 2) in the $R_3$ to $R_5$ of the formula (2) includes a methyl group, an ethyl group, an n-propyl group, a 2-propyl group, and the like. A methyl group is preferable.

The polyimide precursor having the structural unit represented by the formula (1) can be obtained by, for example, reacting a tetracarboxylic dianhydride represented by the following formula (8) and a diamino compound represented by the following formula (9) in an organic solvent such as N-methyl-2-pyrrolidone to obtain a polyamide acid, adding a compound represented by the following formula (10), and reacting in the organic solvent to partially introduce an ester group.

The tetracarboxylic dianhydride represented by the formula (8) and the diamino compound represented by the formula (9) may be used alone or in combination of two or more.

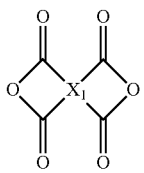
(8)

In the formula (8), X$_1$ is a group corresponding to the X$_1$ of the formula (1).

$$H_2N-Y_1-NH_2 \quad (9)$$

In the formula (9), Y$_1$ is as defined in the formula (1).

$$R-OH \quad (10)$$

In the formula (10), R is a group represented by the formula (2).

The component (A) may have a structural unit other than the structural unit represented by the formula (1).

Examples of the structural unit other than the structural unit represented by the formula (1) include the structural unit represented by the following formula (11).

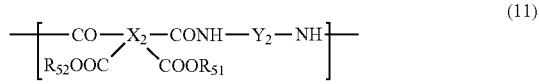
(11)

In the formula (11), X$_2$ is a tetravalent aromatic group, —COOR$_{51}$ group and —CONH— group are on ortho-position to each other, —COOR$_{52}$ group and —CO— group are on ortho-position to each other; Y$_2$ is a divalent aromatic group; and R$_{51}$ and R$_{52}$ are independently a hydrogen atom or an aliphatic hydrocarbon group having 1 to 4 carbon atoms.)

Examples of the tetravalent aromatic group of X$_2$ of the formula (11) include the same as the tetravalent aromatic group of X$_1$ of the formula (1).

Examples of the divalent aromatic group of Y$_2$ of the formula (11) include the same as the divalent aromatic group of Y$_1$ of the formula (1).

Examples of the aliphatic hydrocarbon group having 1 to 4 carbon atoms of R$_{51}$ and R$_{52}$ of the formula (11) include the same as the aliphatic hydrocarbon group having 1 to 4 carbon atoms of R$_1$ and R$_2$.

The structural unit other than the structural unit represented by the formula (1) may be used alone or in combination of two or more.

The content of the structural unit other than the structural unit represented by the formula (1) is preferably less than 50 mol %, based on all the structural units of the component (A).

In the component (A), the ratio of the carboxy group esterified with the group represented by the formula (2) to the total carboxy group and the total carboxy ester is preferably 50 mol % or more, more preferably 60 to 100 mol %, and still more preferably 70 to 90 mol %.

The molecular weight of the component (A) is not particularly limited, but the number average molecular weight is preferably 10,000 to 200,000.

The number average molecular weight can be measured by, for example, a gel permeation chromatography method, and can be calculated by conversion using a standard polystyrene calibration curve.

The photosensitive resin composition of the present invention comprises (B) a polymerizable monomer having an aliphatic cyclic skeleton (preferably having 4 to 15 carbon atoms, more preferably having 5 to 12 carbon atoms). As a result, hydrophobicity can be imparted to the cured product that can be formed, and a decrease in adhesion between the cured product and the substrate under high temperature and high humidity conditions can be suppressed.

The component (B) preferably comprises a polymerizable monomer comprising (preferably, 2 or more) groups having a polymerizable unsaturated double bond (preferably, (meth)acrylic groups, which can be polymerized by a photopolymerization initiator) and comprising an aliphatic cyclic skeleton, and it preferably comprises 2 to 3 groups having a polymerizable unsaturated double bond in order to improve crosslinking density and photosensitivity and to suppress swelling of the pattern after development.

The component (B) preferably comprises a polymerizable monomer represented by the following formula (3).

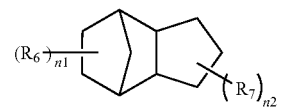
(3)

In the formula (3), R$_6$ and R$_7$ are independently an aliphatic hydrocarbon group having 1 to 4 carbon atoms or a group represented by the following formula (4); n1 is 0 or 1, n2 is an integer of 0 to 2, the number of n1+n2 is 1 or more (preferably 2 or 3); and at least one (preferably 2 or 3) of n1-number of R$_6$ and n2-number of R$_7$ is a group represented by the formula (4).

When two R$_7$ are present, the two R$_7$ may be the same or different.

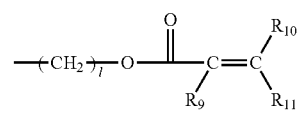
(4)

In the formula (4), R$_9$ to R$_{11}$ is independently a hydrogen atom or an aliphatic hydrocarbon group having 1 to 3 carbon atoms, and I is an integer of 0 to 10 (preferably 0, 1 or 2).

It is more preferable that the component (B) comprises a polymerizable monomer represented by the following formula (5).

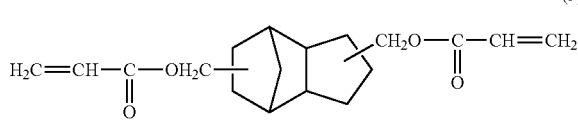
(5)

As the component (B), for example, the following polymerizable monomers may be used.

(12)

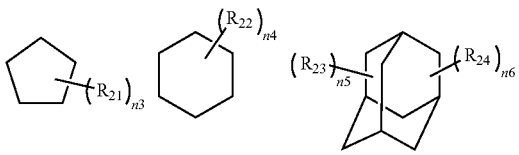

In the formula (12), $R_{21}$ to $R_{24}$ are independently an aliphatic hydrocarbon group having 1 to 4 carbon atoms or a group represented by the formula (4). n3 is an integer from 1 to 3, preferably 2 or 3. n4 is an integer of 1 to 3, preferably 2 or 3. n5 is 0 or 1 and n6 is 0 or 1. n5+n6 is 1 or more, preferably 2.

When two or more $R_{21}$ are present, the two or more $R_{21}$ may be the same or different.

When two or more $R_{22}$ are present, the two or more $R_{22}$ may be the same or different.

At least one (preferably 2 or 3) of n3-number of $R_{21}$ is a group represented by the formula (4).

At least one (preferably 2 or 3) of n4-number of $R_{22}$ is a group represented by the formula (4).

At least one (preferably 2) of n5-number of $R_{23}$ and n6-number of $R_{24}$ is a group represented by the formula (4).

The aliphatic hydrocarbon groups having 1 to 4 carbon atoms in the $R_6$ and $R_7$ of the formula (3) and the $R_{21}$ to $R_{24}$ of the formula (12) include the same as the aliphatic hydrocarbon group having 1 to 4 carbon atoms in $R_1$ and $R_2$ of the formula (1).

The aliphatic hydrocarbon group having 1 to 3 carbon atoms in the $R_9$ to $R_{11}$ of the formula (4) includes the same as the aliphatic hydrocarbon group having 1 to 3 carbon atoms in $R_3$ to $R_5$ of the formula (2).

The component (B) may be used alone or in combination of two or more.

The content of the component (B) is preferably 1 to 50 parts by mass with respect to 100 parts by mass of the component (A). From the viewpoint of improving the hydrophobicity of the cured product, it is more preferably 3 to 50 parts by mass, and still more preferably 5 to 35 parts by mass.

Within the above range, a practical relief pattern is easily obtained, and residue after development of an unexposed portion is easily suppressed.

Examples of the component (C) include, but are not limited to:

benzophenone derivatives such as benzophenone, methyl o-benzoylbenzoate, 4-benzoyl-4'-methyldiphenyl ketone, dibenzyl ketone, and fluorenone;

acetophenone derivatives such as 2,2'-diethoxyacetophenone, 2-hydroxy-2-methylpropiophenone, and 1-hydroxycyclohexylphenyl ketone;

thioxanthone derivatives such as thioxanthone, 2-methylthioxanthone, 2-isopropylthioxanthone, and diethylthioxanthone;

benzyl derivatives such as benzyl, benzyl dimethyl ketal, and benzyl-β-methoxyethyl acetal;

benzoin derivatives such as benzoin and benzoin methyl ether; and oxime esters such as 1-phenyl-1,2-butanedione-2-(o-methoxycarbonyl)oxime, 1-phenyl-1,2-propanedione-2-(o-methoxycarbonyl)oxime, 1-phenyl-1,2-propanedione-2-(o-ethoxycarbonyl)oxime, 1-phenyl-1,2-propanedione-2-(o-benzoyl)oxime, 1,3-diphenylpropanetrione-2-(o-ethoxycarbonyl)oxime, 1-phenyl-3-ethoxypropantrione-2-(o-benzoyl)oxime, ethanone, 1-[9-ethyl-6-(2-methylbenzoyl)-9H-carbazol-3-yl]-,1-(O-acetyloxime), the compound represented by the following compound, and the like.

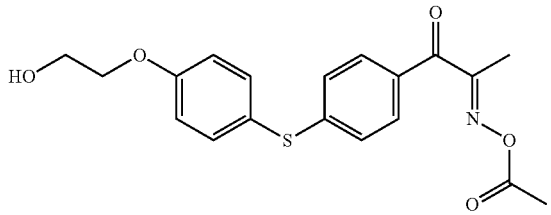 [SMILES: CC(=O)O/N=C(\C)C(=O)c1ccc(Sc2ccc(OCCO)cc2)cc1]

In particular, oxime esters are preferable from the viewpoint of photosensitivity.

The component (C) may be used alone or in combination of two or more.

The content of the component (C) is preferably from 0.1 to 20 parts by mass, more preferably from 0.1 to 10 parts by mass, and still more preferably from 0.1 to 5 parts by mass with respect to 100 parts by mass of the component (A).

Within the above range, the crosslink tends to be uniform in the film thickness direction, and a practical relief pattern can be easily obtained.

The photosensitive resin composition of the present invention comprises (D) solvent.

Examples of the component (D) include N-methyl-2-pyrrolidone, γ-butyrolactone, ethyl lactate, propylene glycol monomethyl ether acetate, benzyl acetate, n-butyl acetate, ethoxyethyl propionate, 3-methylmethoxypropionate, N,N-dimethylformamide, N,N-dimethylacetamide, dimethylsulfoxide, hexamethylphosphorylamide, tetramethylenesulfone, cyclohexanone, cyclopentanone, diethylketone, diisobutyl ketone, methylamyl ketone, N-dimethylmorpholine, and the like, and are usually not particularly limited as long as other components can be sufficiently dissolved.

Among them, N-methyl-2-pyrrolidone, γ-butyrolactone, ethyl lactate, propylene glycol monomethyl ether acetate, N,N-dimethylformamide, and N,N-dimethylacetamide are preferably used from the viewpoint of excellent solubility of each component and applicability at the time of forming a photosensitive resin film.

As the component (D), a compound represented by the following formula (21) may be used.

(21)

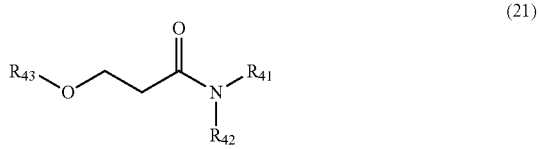

In the formula, $R_{41}$ to $R_{43}$ is independently an alkyl group having 1 to 10 carbon atoms.

Examples of the alkyl group having 1 to 10 (preferably 1 to 3, more preferably 1 or 3) carbon atoms of $R_{41}$ to $R_{43}$ in the formula (21) include a methyl group, an ethyl group, an n-propyl group, an isopropyl group, an n-butyl group, a t-butyl group, a pentyl group, a hexyl group, a heptyl group, an octyl group, and the like.

The compound represented by the formula (21) is preferably 3-methoxy-N,N-dimethylpropanamide (e.g., KJCMPA-100, manufactured by KJ Chemicals Corporation).

The component (D) may be used alone or in combination of two or more.

The content of the component (D) is not particularly limited, but is generally 50 to 1000 parts by mass with respect to 100 parts by mass of the component (A).

The photosensitive resin composition of the present invention may further comprise (E) a thermal polymerization initiator (hereinafter also referred to as "component (E)") from the viewpoint of promoting the polymerization reaction.

As the component (E), a compound which does not decompose by heating (drying) for removing a solvent at the time of film formation but decomposes by heating at the time of curing to generate radicals and accelerates polymerization reaction of components (B) with each other or between component (A) and component (B) is preferable.

The component (E) is preferably a compound having a decomposition point of 110° C. or more and 200° C. or less, and from the viewpoint of promoting the polymerization reaction at a lower temperature, a compound having a decomposition point of 110° C. or more and 175° C. or less is more preferable.

Specific examples include ketone peroxides such as methyl ethyl ketone peroxide; peroxyketals such as 1,1-di(t-hexylperoxy)-3,3,5-trimethylcyclohexane, 1,1-di(t-hexylperoxy)cyclohexane, 1,1-di(t-butylperoxy)cyclohexane; hydroperoxides such as 1,1,3,3-tetramethylbutyl hydroperoxide, cumene hydroperoxide, p-menthane hydroperoxide; dialkyl dioxides such as dicumyl peroxide, di-t-butyl peroxide; diacyl peroxides such as dilauroyl peroxide and dibenzoyl peroxide; peroxydicarbonates such as di(4-t-butylcyclohexyl)peroxydicarbonate and di(2-ethylhexyl)peroxydicarbonate; peroxyesters such as t-butylperoxy-2-ethylhexanoate, t-hexylperoxyisopropyl monocarbonate, t-butyl peroxybenzoate, 1,1,3,3-tetramethylbutylperoxy-2-ethylhexanoate; bis(1-phenyl-1-methylethyl)peroxide, and the like. Commercially available products include the trade names "PERCUMYL D," "PERCUMYL P," "PERCUMYL H" (manufactured by NOF CORPORATION) and the like.

When the component (E) is comprised, the content of the component (E) is preferably from 0.1 to 20 parts by mass with respect to 100 parts by mass of the component (A), more preferably from 0.2 to 20 parts by mass to ensure good flux resistance, and more preferably from 0.3 to 10 parts by mass from the viewpoint of suppressing a decrease in solubility due to decomposition at the time of drying.

The photosensitive resin composition of the present invention may comprise a coupling agent, a surfactant or a leveling agent, a rust inhibitor, a polymerization inhibitor, and the like.

Usually, the coupling agent reacts with the component (A) and crosslinks in the heat treatment after development, or the coupling agent itself polymerizes in the heat treatment step. As a result, it is possible to further improve the adhesiveness between the obtained cured product and the substrate.

Examples of preferred silane coupling agents include compounds having urea bond (—NH—CO—NH—). As a result, even when curing is performed at a low temperature of 200° C. or less, the adhesiveness to the substrate can be further enhanced.

The compound represented by the following formula (13) is more preferable from the viewpoint of excellent manifestation of adhesiveness when curing is performed at a low temperature.

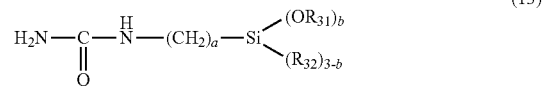

In the formula (13), $R_{31}$ and $R_{32}$ are independently alkyl group having 1 to 5 carbon atoms; a is an integer of 1 to 10, and b is an integer of 1 to 3.

Specific examples of the compound represented by the formula (13) include ureidomethyltrimethoxysilane, ureidomethyltriethoxysilane, 2-ureidoethyltrimethoxysilane, 2-ureidoethyltriethoxysilane, 3-ureidopropyltrimethoxysilane, 3-ureidopropyltriethoxysilane, 4-ureidobutyltrimethoxysilane, 4-ureidobutyltriethoxysilane, and the like. 3-ureidopropyltriethoxysilane is preferable.

As the silane coupling agent, a silane coupling agent having a hydroxy group or a glycidyl group may be used. When a silane coupling agent having a hydroxy group or a glycidyl group and a silane coupling agent having a urea bond in the molecular are used in combination, the adhesiveness of the cured product to the substrate when cured at a low temperature can be further improved.

Examples of silane coupling agent having hydroxyl or glycidyl group include methylphenylsilanediol, ethylphenylsilanediol, n-propylphenylsilanediol, isopropylphenylsilanediol, n-butylphenylsilanediol, isobutylphenylsilanediol, tert-butylphenylsilanediol, diphenylsilanediol, ethylmethylphenylsilanol, n-propylmethylphenylsilanol, isopropylmethylphenylsilanol, n-butylmethylphenylsilanol, isobutylmethylphenylsilanol, tert-butylmethylphenylsilanol, ethyl-n-propylphenylsilanol, ethylisopropylphenylsilanol, n-butylethylphenylsilanol, isobutylethylphenylsilanol, tert-butylethylphenylsilanol, methyldiphenylsilanol, ethyldiphenylsilanol, n-propyldiphenylsilanol, isopropyldiphenylsilanol, n-butyldiphenylsilanol, isobutyldiphenylsilanol, tert-butyldiphenylsilanol, phenylsilanetriol, 1,4-bis(trihydroxysilyl)benzene, 1,4-bis(methyldihydroxysilyl)benzene, 1,4-bis(ethyldihydroxysilyl)benzene, 1,4-bis(propyldihydroxysilyl)benzene, 1,4-bis(butyldihydroxysilyl)benzene, 1,4-bis(dimethylhydroxysilyl)benzene, 1,4-bis(diethylhydroxysilyl)benzene, 1,4-bis(dipropylhydroxysilyl)benzene, 1,4-bis(dibuthylhydroxysilyl)benzene, and compound represented by the following formula (14). Among them, the compound represented by the formula (14) is particularly preferable in order to further improve the adhesiveness to the substrate.

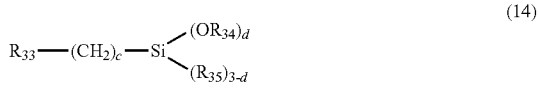

In the formula (14), $R_{33}$ is a monovalent organic group having a hydroxyl group or a glycidyl group, $R_{34}$ and $R_{35}$ are independently an alkyl group having 1 to 5 carbon atoms; c is an integer of 1 to 10, and d is an integer of 1 to 3.

Examples of the compound represented by the formula (14) include hydroxymethyltrimethoxysilane, hydroxymethyltriethoxysilane, 2-hydroxyethyltrimethoxysilane, 2-hydroxyethyltriethoxysilane, 3-hydroxypropyltrimethoxysilane, 3-hydroxypropyltriethoxysilane, 4-hydroxybutyltrimethoxysilane, 4-hydroxybutyltriethoxysilane, glycidoxymethyltrimethoxysilane, glycidoxymethyltriethoxysilane, 2-glycidoxyethyltrimethoxysilane, 2-glycidoxyethyltriethoxysilane, 3-glycidoxypropyltrimethoxysilane, 3-glycidoxypropyltriethoxysilane, 4-glycidoxybutyltrimethoxysilane, and 4-glycidoxybutyltriethoxysilane and the like.

The silane coupling agent having a hydroxy group or a glycidyl group preferably further comprises a nitrogen atom, and a silane coupling agent having an amino group or an amide bond is preferable.

Examples of silane coupling agent having amino group include bis(2-hydroxymethyl)-3-aminopropyltriethoxysilane, bis(2-hydroxymethyl)-3-aminopropyltrimethoxysilane, bis(2-glycidoxymethyl)-3-aminopropyltriethoxysilane, bis(2-hydroxymethyl)-3-aminopropyltrimethoxysilane, and the like.

Examples of the silane coupling agent having an amide bond include compounds represented by $R_{36}$—$(CH_2)_e$—CO—NH—$(CH_2)_f$—$Si(OR_{37})_3$ ($R_{36}$ is a hydroxyl group or a glycidyl group, e and f are independently an integer of 1 to 3, and $R_{37}$ is a methyl group, an ethyl group, or a propyl group).

Silane coupling agents may be used alone or in combination of two or more.

When a silane coupling agent is used, the content of the silane coupling agent is preferably 0.1 to 20 parts by mass, more preferably 1 to 10 parts by mass, and still more preferably 0.3 to 10 parts by mass with respect to 100 parts by mass of the component (A).

By comprising a surfactant or a leveling agent, coating property (for example, suppression of striation (unevenness in film thickness)) and developability can be improved.

Examples of the surfactant or leveling agent include polyoxyethylene lauryl ether, polyoxyethylene stearyl ether, polyoxyethylene oleyl ether, and polyoxyethylene octyl phenol ether, and the like. Examples of commercially available products include the trade names "Megaface F171," "F173," "R-08" (manufactured by DIC Corporation), "Florard FC430," "FC431" (manufactured by 3M Japan Limited), and "organosiloxane polymer KP341," "KBM303," "KBM403," and "KBM803" (manufactured by Shin-Etsu Chemical Co., Ltd.).

The surfactant and the leveling agent may be used alone or in combination of two or more.

When the surfactant or leveling agent is included, the content of the surfactant or leveling agent is preferably 0.01 to 10 parts by mass, more preferably 0.05 to 5 parts by mass, and still more preferably 0.05 to 3 parts by mass with respect to 100 parts by mass of the component (A).

By comprising the rust inhibitor, corrosion of copper and copper alloy can be suppressed and discoloration of copper and copper alloy can be prevented.

Examples of the rust inhibitor include triazole derivatives, tetrazole derivatives and the like.

The rust inhibitor may be used alone, or in combination of two or more.

When the rust inhibitor is used, the content of the rust inhibitor is preferably 0.01 to 10 parts by mass, more preferably 0.1 to 5 parts by mass, and more preferably 0.5 to 3 parts by mass with respect to 100 parts by mass of the component (A).

By comprising the polymerization inhibitor, good storage stability can be ensured.

Examples of the polymerization inhibitor include a radical polymerization inhibitor, a radical polymerization depressant, and the like.

Examples of the polymerization inhibitor include p-methoxyphenol, diphenyl-p-benzoquinone, benzoquinone, hydroquinone, pyrogallol, phenothiazine, resorcinol, orthodinitrobenzene, pallazinitrobenzene, methadinitrobenzene, phenanthraquinone, N-phenyl-2-naphthylamine, cuperone, 2,5-toluquinone, tannic acid, parabendylaminophenol, nitrosamines, and the like.

The polymerization inhibitor may be used alone, or in combination of two or more.

When the polymerization inhibitor is comprised, the content of the polymerization inhibitor is preferably 0.01 to 30 parts by mass, more preferably 0.01 to 10 parts by mass, and still more preferably 0.05 to 5 parts by mass with respect to 100 parts by mass of the component (A) from the viewpoint of storage stability of the photosensitive resin composition and heat resistance of the cured product obtained.

The photosensitive resin composition of the present invention essentially consists of components (A) to (D), and optionally, component (E), a coupling agent, a surfactant, a leveling agent, a rust inhibitor, and a polymerization inhibitor, and may comprise other unavoidable impurities as long as the effect of the present invention is not impaired.

For example, 80% by mass or more, 90% by mass or more, 95% by mass or more, 98% by mass or more, or 100% by mass of the photosensitive resin composition of the present invention may be consist of the components (A) to (D), the components (A) to (E) or the components (A) to (D) and optionally components (E), a coupling agent, a surfactant, a leveling agent, a rust inhibitor, and a polymerization inhibitor.

The cured product of the present invention can be obtained by curing the photosensitive resin composition described above.

The cured product of the present invention may be used as a pattern cured product or a cured product without a pattern.

The thickness of the cured product of the present invention is preferably 5 to 20 μm.

The method for manufacturing a pattern cured product of the present invention comprises a step of coating the photosensitive resin composition on a substrate and drying to form a photosensitive resin film, a step of pattern-exposing the photosensitive resin film to obtain a resin film, a step of developing the resin film after pattern-exposure using an organic solvent to obtain a pattern resin film, and a step of heat-treating the pattern resin film.

As a result, a pattern cured product can be obtained.

A method of manufacturing a cured product without a pattern comprises, for example, the above-described steps of forming a photosensitive resin film and a step of heat treatment. Further, a step of exposing may be comprised.

Examples of the substrate include a glass substrate, a semiconductor substrate such as a silicon wafer, a $TiO_2$ substrate, a metal-oxide-insulator substrate such as a $SiO_2$ substrate, a silicon nitride substrate, a copper substrate, and a copper alloy substrate.

The coating method is not particularly limited, but can be performed using a spinner or the like.

The drying can be performed using a hot plate, an oven, or the like.

The drying temperature is preferably 90 to 150° C., and more preferably 90 to 120° C. from the viewpoint of ensuring dissolution contrast.

The drying time is preferably 30 seconds to 5 minutes.

The drying may be performed two or more times.

As a result, a photosensitive resin film in which the photosensitive resin composition described above is formed in a film shape can be obtained.

The film thickness of the photosensitive resin film is preferably 5 to 100 µm, more preferably 6 to 50 µm, and still more preferably 7 to 30 µm.

In the pattern exposure, for example, a predetermined pattern is exposed through a photomask.

The active light to be irradiated includes ultraviolet rays such as i-line, visible rays, radiation, and the like. It is preferable to use i-line.

As the exposure apparatus, a parallel exposure machine, a projection exposure machine, a stepper, a scanner exposure machine, or the like can be used.

As a result of development, a pattern resin film can be obtained. Generally, when a negative photosensitive resin composition is used, unexposed portions are removed with a developer.

As an organic solvent used as the developer, a good solvent of the photosensitive resin film can be used alone or a mixture of a good solvent and a poor solvent of the photosensitive resin film can be used as appropriate.

Examples of the good solvent include N-methyl-2-pyrrolidone, N-acetyl-2-pyrrolidone, N,N-dimethylacetamide, N,N-dimethylformamide, dimethyl sulfoxide, gammabutyrolactone, α-acetyl-gammabutyrolactone, cyclopentanone, cyclohexanone, and the like.

Examples of the poor solvent include toluene, xylene, methanol, ethanol, isopropanol, propylene glycol monomethyl ether acetate, propylene glycol monomethyl ether, water, and the like.

A surfactant may be added to the developer. The additive amount is preferably 0.01 to 10 parts by mass and more preferably 0.1 to 5 parts by mass with respect to 100 parts by mass of the developer.

The development time can be, for example, twice as long as the time until the photosensitive resin film is immersed and completely dissolved.

The development time varies depending on the component (A) used, but is preferably from 10 seconds to 15 minutes, more preferably from 10 seconds to 5 minutes, and more preferably from 20 seconds to 5 minutes from the viewpoint of productivity.

After development, washing may be performed with a rinse solution.

As the rinse solution, distilled water, methanol, ethanol, isopropanol, toluene, xylene, propylene glycol monomethyl ether acetate, propylene glycol monomethyl ether, or the like may be used alone or as a mix as appropriate, or may be used in a stepwise combination.

A pattern cured product can be obtained by heat-treating the pattern resin film.

The polyimide precursor of the component (A) undergoes a dehydration ring closure reaction by a heat treatment step, usually resulting in the corresponding polyimide.

The temperature of the heat treatment is preferably 250° C. or less, more preferably 120 to 250° C., and more preferably 200° C. or less or 160 to 200° C.

Within the above range, damage to the substrate and the device can be suppressed to a small level, the device can be produced with a high yield, and energy saving of the process can be realized.

The time of the heat treatment is preferably 5 hours or less, more preferably 30 minutes to 3 hours.

Within the above range, the crosslinking reaction or the dehydration ring closure reaction can sufficiently proceed.

The atmosphere of the heat treatment may be an air atmosphere or an inert atmosphere such as nitrogen, but from the viewpoint of preventing oxidation of the pattern resin film, the atmosphere is preferably a nitrogen atmosphere.

Examples of the device used for the heat treatment include a quartz tube oven, a hot plate, a rapid thermal annealing, a vertical diffusion furnace oven, an infrared curing oven, an electron beam curing oven, and a microwave curing oven.

The cured product of the present invention can be used as a passivation film, a buffer coat film, an interlayer insulating film, a cover coat layer, a surface protective film, or the like.

With the use of one or more selected from the group consisting of the passivation film, the buffer coat film, the interlayer insulating film, the cover coat layer, the surface protective film, and the like, highly reliable electronic components such as semiconductor devices, multilayer wiring boards, various electronic devices, and laminated devices (such as multi-die fan-out wafer level packages) can be manufactured.

An example of a manufacturing process of a semiconductor apparatus which is an electronic component of the present invention will be described with reference to the drawings.

FIG. 1 is a manufacturing process diagram of a semiconductor apparatus having a multilayer wiring structure which is an electronic component according to an embodiment of the present invention.

In FIG. 1, a semiconductor substrate 1 such as a Si substrate having a circuit device is covered with a protective film 2 such as a silicon oxide film except a predetermined portion of the circuit device, and a first conductor layer 3 is formed on the exposed circuit device. Thereafter, an interlayer insulating film 4 is formed on the semiconductor substrate 1.

Next, a photosensitive resin layer 5 such as a chlorinated rubber-based resin, a phenolic novolac-based resin, or the like is formed on the interlayer insulating film 4, and a window 6A is provided so that a predetermined portion of the interlayer insulating film 4 is exposed by a known photolithography technique.

The interlayer insulating film 4 in which the window 6A is exposed is selectively etched to provide a window 6B.

Next, the photosensitive resin layer 5 is completely removed by using an etchant that etches only the photosensitive resin layer 5 without corroding the first conductive layer 3 exposed from the window 6B.

Further, the second conductive layer 7 is formed and electrically connected to the first conductive layer 3 by using a known photolithography technique.

In the case of forming a multilayer wiring structure of three or more layers, each layer can be formed by repeating the above steps.

Next, by using the above-mentioned photosensitive resin composition, the window 6C is opened by pattern exposure, and a surface protective film 8 is formed. The surface protective film 8 protects the second conductive layer 7 from external stress, α rays, and the like, and the resulting semiconductor device is excellent in reliability.

In the above example, it is also possible to form the interlayer insulating film using the photosensitive resin composition of the present invention.

EXAMPLES

Hereinafter, the present invention will be described more specifically on the basis of Examples and Comparative Examples. The present invention is not limited to the following Examples.

Synthesis Example 1 (Synthesis of A1)

7.07 g of 3,3',4,4'-diphenyl ether tetracarboxylic acid dianhydride (ODPA) and 4.12 g of 2,2'-dimethylbiphenyl-4,4'-diamine (DMAP) were dissolved in 30 g of N-methyl-2-pyrrolidone (NMP), stirred at 30° C. for 4 hours and then stirred overnight at room temperature to obtain polyamide acid. To this solution, 9.45 g of trifluoroacetic anhydride was added under water cooling, stirred at 45° C. for 3 hours, and 7.08 g of 2-hydroxyethyl methacrylate (HEMA) was added. The reaction solution was added dropwise to distilled water, and the precipitate was collected by filtration and dried under reduced pressure to obtain a polyimide precursor A1.

The number average molecular weight was determined by standard polystyrene conversion using the gel permeation chromatography (GPC) method under the following conditions. The number average molecular weight of A1 was 40,000.

A solution of 1 mL of solvent [tetrahydrofuran (THF)/dimethylformamide (DMF)=1/1 (volume ratio)] was used to measure 0.5 mg of A1.

Measuring instrument: Detector L4000UV manufactured by Hitachi, Ltd.

Pumps: L6000 manufactured by Hitachi, Ltd.

C-R4A Chromatopac manufactured by Shimadzu Corporation

Measuring conditions: column Gelpack GL-S300MDT-5×2

Eluent:THF/DMF=1/1 (volume ratio)

LiBr (0.03 mol/L), $H_3PO_4$ (0.06 mol/L)

"Flow rate: 1.0 mL/min, detector: UV 270 nm"

The esterification ratio of A1 (the ratio of reaction with the HEMA of the carboxylic group of ODPA) was calculated by NMR-measurement under the following condition. The esterification ratio was 80 mol %, based on the total carboxyl groups of the polyamide acid, with the remaining 20 mol % being carboxyl groups.

Measuring instrument: AV400M manufactured by Bruker Japan K.K.

Magnetic field strength: 400 MHz

Reference substance: tetramethylsilane (TMS)

Solvent: Dimethyl sulfoxide (DMSO)

Examples 1 to 11 and Comparative Example 1

(Preparation of the Photosensitive Resin Composition)

The photosensitive resin compositions of Examples 1 to 11 and Comparative Example 1 were prepared by the components and the amounts shown in Table 1. The amounts in Table 1 are parts by weight of each component with respect to 100 parts by weight of A1.

The components used are as follows. As a component (A), A1 obtained in Synthetic Example 1 was used.

Component (B): a polymerizable monomer having an aliphatic cyclic skeleton

B1: A-DCP (Tricyclodecanedimethanol diacrylate, manufactured by Shin-Nakamura Chemical Co., Ltd.)

Component (B')

B2: tetraethylene glycol dimethacrylate

B3: A-TMMT (pentaerythritol tetraacrylate, manufactured by Shin-Nakamura Chemical Co., Ltd.)

Component (C): a photopolymerization initiator

C1: IRUGCURE OXE 02 (Ethanone, 1-[9-ethyl-6-(2-methylbenzoyl)-9H-carbazol-3-yl]-,1-(O-acetyloxime), manufactured by BASF Japan Ltd.)

C2: G-1820 (PDO) (1-phenyl-1,2-propanedione-2-(O-ethoxycarbonyl)oxime, manufactured by Lambson Ltd.)

Component (D): a solvent

D1: N-methyl-2-pyrrolidone

D2: KJCMPA-100 (compound represented by the following formula D2, manufactured by KJ Chemicals Corporation)

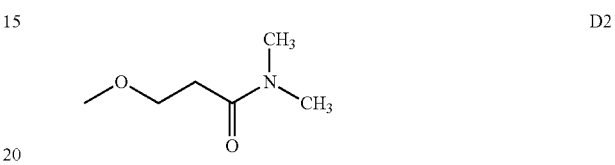

Component (E): a thermal polymerization initiator

E1: PERCUMYL D (bis(1-phenyl-1-methylethyl) peroxide, compound represented by the following formula, manufactured by NOF CORPORATION)

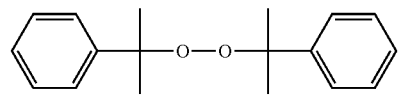

(Manufacture of Pattern Cured Product)

The obtained photosensitive resin composition was spin-coated on a silicon wafer using a coating device Act8 (manufactured by Tokyo Electron Limited), dried at 100° C. for 2 minutes, and then dried at 110° C. for 2 minutes to form a photosensitive resin film having a dry film thickness of 7 to 15 μm.

The development time was set to twice the time required to completely dissolve the obtained photosensitive resin film by immersion in cyclopentanone.

In addition, a photosensitive resin film was produced in the same manner as described above, and the obtained photosensitive resin film was exposed by irradiating predetermined patterns with i-line of 50 to 550 mJ/cm² at 50 mJ/cm² increment using an i-line stepper FPA-3000iW (manufactured by Canon Inc.).

The exposed resin film was paddle-developed in cyclopentanone using a Act8 for the above development time, and then rinsed with propylene glycol monomethyl ether acetate (PGMEA) to obtain a pattern resin film.

The obtained pattern resin film was heated at 175° C. for 1 hour in a nitrogen atmosphere using a vertical diffusion furnace μ-TF (manufactured by Koyo Thermo Systems Co., Ltd.) to obtain a pattern cured product (film thickness after curing: 10 μm).

(Residual Film Ratio after Curing)

In the manufacture of the above-mentioned cured product, the thickness of the film after heating for 2 minutes on a hot plate at 110° C. and the thickness of the film after curing were measured by exposing the silicon wafers by cutting a part of the film and measuring the height of the silicon wafers from the surface of the exposed silicon wafers to the surface of the film using the stylus-style Profiler Dektak150 (manufactured by Bruker) (the same will be applied hereafter). After the cured film thickness of 10 μm was divided by the film thickness after heating for 2 minutes on a hot plate at 110° C., the percentage was obtained, and the residual film ratio after curing was obtained. The results are shown in Tables 1 and 2.

(Evaluation of Chemical Resistance)

The obtained pattern cured product was immersed in NMP heated to 80° C. for 30 minutes. After cooling, it was washed with acetone and dried.

The film thickness of the pattern cured product after drying was measured, and the absolute value of "(film thickness before NMP immersion)–(film thickness of the pattern cured product after NMP immersion and drying)" was divided by the film thickness before NMP immersion to obtain a percentage, thereby calculating the film thickness change ratio. The change in film thickness was evaluated by setting a film thickness change ratio of less than 5% to be "O", a film thickness change ratio of 5 to 10% to be "A", and a film thickness change ratio of more than 10% to be "X". The results are shown in Tables 1 and 2.

(Evaluation of Adhesion)

The above photosensitive resin compositions were spin-coated on a Cu-plated wafer using a coating device Act8 (manufactured by Tokyo Electron Limited), dried at 100° C. for 2 minutes, and then dried at 110° C. for 2 minutes to form a photosensitive resin film.

An exposure was carried out at 500 mJ/cm$^2$ using a proximity exposure machine mask aligner MA8 (manufactured by SÜSS MICROTEC SE.) on the obtained photosensitive resin film.

After the exposure, the resin film was cured in the same manner as in the above-mentioned pattern cured product, thereby obtaining a cured product.

The obtained cured product was placed in a saturation type pressure cooker apparatus (manufactured by HIRAYAMA Manufacturing Corporation) and treated at a temperature of 121° C. and a relative humidity of 100% for 300 hours.

After 300 hours of treatment, the cured product was taken out, the epoxy resin layer at the tip of the aluminum stud was fixed to the cured product surface, and heated in an oven at 150° C. for 1 hour to adhere the epoxy resin layer and the cured product. Then, using a thin film adhesion strength measuring apparatus ROMULUS (manufactured by QUAD Group Inc.), the stud was pulled, the load at the time when it was peeled was measured, and the peeling mode was observed.

In the observation of the peeling mode, the case in which cohesive fracture was observed (there was no peeling between the cured product and the Cu-plated wafer), the load at the time when it was peeled was 500 kg/cm$^2$ or more, and no corrosion (discoloration) was observed in the cured product after the treatment for 300 hours was defined as "0".

The case which peeling was occurred between the cured product and the Cu-plated wafer, the load at the time when it was peeled was less than 500 kg/cm$^2$, or corrosion (discoloration) was observed in the cured product after the treatment of 300 hours was defined as "X".

In the case of cohesive fracture, the adhesive strength between the cured product and the Cu-plated wafer is stronger than the cohesive fracture strength of the cured product. In the case of X, the load at the time when it was peeled is the adhesive strength between the cured product and the Cu-plated wafer.

The results are shown in Tables 1 and 2.

(Evaluation of Migration)

With respect to a Cu sputter wafer (a wafer having a layer configuration of Cu sputter layer (0.1 µm)/Ti seed layer (0.1 µm)/SiN layer (1 µm)/silicon wafer; manufactured by Advanced Material Technologies, Inc.), comb tooth pattern (line width of comb teeth: 100 µm, number of teeth: 9 anodes and 9 cathodes, and spacing: 20 µm) was formed using a resist PMER-P-LA900PM (manufactured by TOKYO OHKA KOGYO CO., LTD.).

After the formation of the comb tooth pattern, Cu-plating was performed (film thickness: 5 µm). After the Cu-plating, the resist was peeled off, and then the Cu sputtered layer and the Ti seed layer were removed to form a copper comb electrode pattern.

The above photosensitive resin composition was spin-coated on a wafer with a copper comb electrode pattern so that the film thickness after curing was 10 µm using a coating device Act8 (manufactured by Tokyo Electron Limited), dried at 100° C. for 2 minutes, and then dried at 110° C. for 2 minutes to form a photosensitive resin film.

An exposure was carried out at 500 mJ/cm$^2$ on the obtained photosensitive resin film using a proximity exposure machine mask aligner MA8 (manufactured by SÜSS MICROTEC SE.).

The exposed resin film was developed and cured to obtain a cured product in the same manner as the manufacture of the pattern cured product described above.

A migration test was conducted for 500 hours by applying a DC6V at 130° C. and relative humidity of 85% using a wafer with a copper comb electrode pattern on which a cured product was formed. Observation was carried out by a metal microscope, and those in which dendrites were not generated between the teeth of the comb, no corrosion (discoloration) of the cured product was observed, and the resistance value was 1.0×4Ω or less were defined as "O". Those in which dendrite was generated between the teeth of the comb, corrosion (discoloration) of the cured product was observed, or the resistance value exceeded 1.0×4Ω defined as "X". The results are shown in Tables 1 and 2.

TABLE 1

|  |  | Example 1 | Example 2 | Example 3 | Example 4 | Example 5 | Example 6 | Example 7 |
|---|---|---|---|---|---|---|---|---|
| Component (A) | A1 | 100 | 100 | 100 | 100 | 100 | 100 | 100 |
| Component (B) | B1 | 35 | 25 | 20 | 15 | 10 | 5 | 35 |
| Component (B') | B2 | — | — | — | — | — | — | — |
|  | B3 | — | — | — | — | — | — | — |
| Component (C) | C1 | 0.5 | 0.5 | 0.5 | 0.5 | 0.5 | 0.5 | 0.5 |
|  | C2 | 4 | 4 | 4 | 4 | 4 | 4 | 4 |
| Component (D) | D1 | 150 | 150 | 150 | 150 | 150 | 150 | 150 |
|  | D2 | — | — | — | — | — | — | — |
| Component (E) | E1 | — | — | — | — | — | — | 2 |
| Residual film ratio after curing (%) |  | 79.9 | 76.4 | 73.1 | 71.7 | 71.0 | 70.6 | 90.5 |
| Chemical resistance |  | ○ | ○ | Δ | Δ | Δ | Δ | ○ |

TABLE 1-continued

| | Example 1 | Example 2 | Example 3 | Example 4 | Example 5 | Example 6 | Example 7 |
|---|---|---|---|---|---|---|---|
| Load at the time when it was peeled (kg/cm$^2$) | 713 | 621 | 658 | 624 | 700 | 708 | 655 |
| Peeling mode | ○ | ○ | ○ | ○ | ○ | ○ | ○ |
| Migration | ○ | ○ | ○ | ○ | ○ | ○ | ○ |

TABLE 2

| | | Example 8 | Example 9 | Example 10 | Example 11 | Example 12 | Example 13 | Comp. Ex. 1 |
|---|---|---|---|---|---|---|---|---|
| Component (A) | A1 | 100 | 100 | 100 | 100 | 100 | 100 | 100 |
| Component (B) | B1 | 20 | 15 | 15 | 10 | 20 | 20 | — |
| Component (B') | B2 | — | — | — | — | — | — | 20 |
| | B3 | — | — | — | — | — | — | 15 |
| Component (C) | C1 | 0.5 | 0.5 | 0.5 | 0.5 | 0.2 | 0.2 | 0.2 |
| | C2 | 4 | 4 | 4 | 4 | 4 | 4 | 2 |
| Component (D) | D1 | 150 | 150 | 150 | 150 | — | — | 150 |
| | D2 | — | — | — | — | 150 | 150 | — |
| Component (E) | E1 | 2 | 0.5 | 2 | 2 | — | 2 | — |
| Residual film ratio after curing (%) | | 87.8 | 80.6 | 85.4 | 81.7 | 77.2 | 88.0 | 84.0 |
| Chemical resistance | | ○ | ○ | ○ | ○ | Δ | ○ | Δ |
| Load at the time when it was peeled (kg/cm$^2$) | | 682 | 642 | 685 | 650 | 630 | 647 | 173 |
| Peeling mode | | ○ | ○ | ○ | ○ | ○ | ○ | x |
| Migration | | ○ | ○ | ○ | ○ | ○ | ○ | x |

INDUSTRIAL APPLICABILITY

The photosensitive resin composition of the present invention can be used for an interlayer insulating film, a cover coat layer, a surface protective film, or the like, and the interlayer insulating film, the cover coat layer, or the surface protective film of the present invention can be used for an electronic component or the like.

While some embodiments and/or examples of the present invention have been described in detail above, those skilled in the art will readily make many changes to these illustrative embodiments and/or examples without materially departing from the novel teachings and advantages of the invention. Accordingly, many of these modifications are within the scope of the invention.

The patent documents mentioned in this specification and the content of the application serving as a basis of claiming the priority concerning the present application to the Paris Convention are all incorporated by reference.

The invention claimed is:

1. A photosensitive resin composition consisting essentially of:
   (A) a polyimide precursor having a polymerizable unsaturated bond;
   (B) a polymerizable monomer having an aliphatic cyclic skeleton;
   (C) a photopolymerization initiator;
   (D) a solvent; and
   optionally, one or more of a thermal polymerization initiator, a coupling agent, a surfactant or a leveling agent, a rust inhibitor, and a polymerization inhibitor.

2. The photosensitive resin composition according to claim 1, wherein the component (A) is a polyimide precursor having a structural unit represented by the following formula (1):

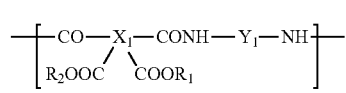
(1)

wherein in the formula (1), $X_1$ is a tetravalent aromatic group, —COOR$_1$ group and —CONH— group are on the ortho-position to each other, —COOR$_2$ group and —CO— group are on the ortho-position to each other; $Y_1$ is a divalent aromatic group; $R_1$ and $R_2$ are independently a hydrogen atom, a group represented by the following formula (2), or an aliphatic hydrocarbon group having 1 to 4 carbon atoms; and at least one of $R_1$ and $R_2$ is a group represented by the formula (2);

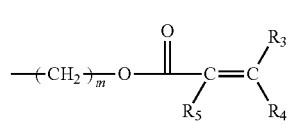
(2)

wherein in the formula (2), $R_3$ to $R_5$ is independently a hydrogen atom or an aliphatic hydrocarbon group having 1 to 3 carbon atoms, and m is an integer of 1 to 10.

3. The photosensitive resin composition according to claim 1, wherein the component (B) comprises a polymerizable monomer having a group comprising a polymerizable unsaturated double bond and having an aliphatic cyclic skeleton.

4. The photosensitive resin composition according to claim 3, wherein the polymerizable monomer has two or more groups comprising the polymerizable unsaturated double bond.

5. The photosensitive resin composition according to claim 1, wherein the component (B) comprises a polymerizable monomer represented by the following formula (3):

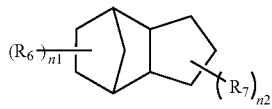
(3)

wherein in the formula (3), $R_6$ and $R_7$ are independently an aliphatic hydrocarbon group having 1 to 4 carbon atoms or a group represented by the following formula (4); n1 is 0 or 1; n2 is an integer of 0 to 2; the number of n1+n2 is 1 or more; and at least one of n1-number of $R_6$ and n2-number of $R_7$ is a group represented by the following formula (4);

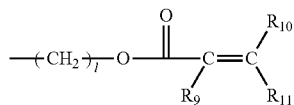
(4)

wherein in the formula (4), $R_9$ to $R_{11}$ is independently a hydrogen atom or an aliphatic hydrocarbon group having 1 to 3 carbon atoms, and I is an integer of 0 to 10.

6. The photosensitive resin composition according to claim 5, wherein the number of n1+n2 is 2 or 3.

7. The photosensitive resin composition according to claim 1, wherein the component (B) comprises a polymerizable monomer represented by the following formula (5)

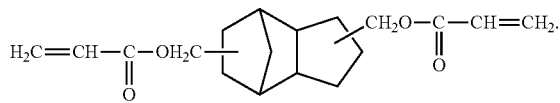
(5)

8. The photosensitive resin composition according to claim 1, further comprising (E) a thermal polymerization initiator.

9. A method of manufacturing the pattern cured product comprising:

applying the photosensitive resin composition according to claim 1 on a substrate and drying the photosensitive resin composition to form a photosensitive resin film;

pattern-exposing the photosensitive resin film to obtain a resin film;

developing the resin film after the pattern exposure using an organic solvent to obtain a pattern resin film; and heat-treating the pattern resin film.

10. The method for manufacturing the pattern cured product according to claim 9, wherein a temperature of the heat treatment is 200° C. or less.

11. A cured product obtained by coating and then curing the photosensitive resin composition according to claim 1.

12. The pattern cured product obtained by the method according to claim 9.

13. An interlayer insulating film, a cover coat layer, or a surface protective film comprising the cured product according to claim 11.

14. An electronic component comprising a semiconductor substrate having a circuit device and the interlayer insulating film, the cover coat layer, or the surface protective film according to claim 13 provided over the semiconductor substrate having the circuit device.

* * * * *